United States Patent [19]

Ramachandra et al.

[11] Patent Number: 4,679,310
[45] Date of Patent: Jul. 14, 1987

[54] METHOD OF MAKING IMPROVED METAL SILICIDE FUSE FOR INTEGRATED CIRCUIT STRUCTURE

[75] Inventors: Govardhan Ramachandra, Sunnyvale; Kiran M. Bhatt, Milpitas, both of Calif.

[73] Assignee: Advanced Micro Devices, Inc., Sunnyvale, Calif.

[21] Appl. No.: 794,216

[22] Filed: Oct. 31, 1985

[51] Int. Cl.$^4$ ............................................. H01L 21/90
[52] U.S. Cl. ............................... 29/577 R; 29/577 C; 29/571; 29/590; 29/623; 148/DIG. 55; 148/DIG. 147; 357/71
[58] Field of Search .................. 29/577 R, 571, 623, 29/577 C, 590; 148/DIG. 55, DIG. 147; 357/51, 71; 427/93

[56] References Cited

U.S. PATENT DOCUMENTS

| | | | |
|---|---|---|---|
| 3,619,725 | 11/1971 | Mendham et al. | 148/DIG. 55 X |
| 4,032,949 | 6/1977 | Blerig | 357/51 |
| 4,042,950 | 8/1977 | Price | 357/51 |
| 4,089,734 | 5/1978 | Blerig | 156/656 |
| 4,135,295 | 1/1979 | Price | 29/623 |
| 4,413,272 | 11/1983 | Mochizuki et al. | 357/65 |
| 4,499,557 | 2/1985 | Holmberg et al. | 365/161 |
| 4,518,981 | 5/1985 | Schlupp | 357/67 S |
| 4,536,948 | 8/1985 | Te Velde et al. | 29/577 C |
| 4,569,121 | 2/1986 | Lim et al. | 29/574 |

OTHER PUBLICATIONS

Chen, D. C. et al., "A New Device Interconnect Scheme . . ." IEDM 984 pp. 118-121.

*Primary Examiner*—Brian E. Hearn
*Assistant Examiner*—T. N. Quach
*Attorney, Agent, or Firm*—Patrick T. King; John P. Taylor

[57] ABSTRACT

A method of making an improved metal silicide fuse of controlled thickness for an integrated circuit structure is disclosed. The metal silicide fuse is formed by first forming a layer of known thickness of a metal capable of reacting with silicon to form a metal silicide. A layer of amorphous silicon is then formed over the metal and patterned to form the desired fuse dimensions prior to formation of the silicide. The structure is then sintered to form the metal silicide. Excess silicon remaining over the metal silicide fuse layer is then removed as is unreacted metal from areas where no silicon was present to react with the metal to form the silicide. Control of the thickness of the metal layer which subsequently reacts to form the silicide controls the thickness of the subsequently formed silicide layer to thereby form a fuse of reproducible thickness.

15 Claims, 11 Drawing Figures

METHOD OF MAKING IMPROVED METAL SILICIDE FUSE FOR INTEGRATED CIRCUIT STRUCTURE

BACKGROUND OF THE INVENTION

1. Field of the Invention

This invention relates to integrated circuit structures. More particularly, this invention relates to method of making a fuse which can be used in an integrated circuit structure.

2. Description of the Prior Art

In the construction of integrated circuit structures, such as, for example, a programmable readonly memory device (PROM), a fusible link is provided in each memory cell. Selected fuses are then blown during a write sequence by passing sufficient current to the particular cell to blow the fuse.

The use of fuses for such purposes is not, however, free from problems. If metal alloys such as nichrome are used as the fuse material, conductive residues, remaining adjacent the gap from the blown fuse, may subsequently close the gap again by diffusion of such residues. In addition, if the fuse dimensions are not maintained, including the thickness, the amount of current passed through the fuse may either not be sufficient to blow the fuse or, if the current is high enough, the excess heat generated during the blowing of the fuse may produce an undesirable amount of heat. These problems have been addressed to some degree in the prior art.

Bierig U.S. Pat. Nos. 4,032,949 and 4,089,734 describe the construction of platinum fuses for integrated circuit structures using multilayer constructions whereby layers above and beneath the platinum fuse layer are removed so that the fuse is not in direct contact with the substrate to prevent heat, generated when the fuse is blown, from passing directly into the substrate.

Moshizuki et al U.S. Pat. No. 4,413,272 provides a fuse structure with an open window to thereby provide a wider gap between the separated portions of a blown fuse than when the fuse is covered with a protective coating.

Holmberg et al U.S. Pat. No. 4,499,557 describes some of the difficulties which can be encountered with fusible links. The patentees observe that the small gap in the blown fuse can become closed again due to the accumulation of conductive material remaining adjacent the gap. It is also pointed out that the fuse must be constructed with precise dimensions, including thickness, to insure a complete and programmable blowout of the fuse. In this instance, the patentees, rather than attempt to solve such problems, provide an alternate device in substitution for such a fuse.

Price U.S. Pat. Nos. 4,042,950 and 4,135,295, both of which are assigned to the assignee of this application, disclose and claim a metal silicide fuse in which a layer of polysilicon is first placed on the device and patterned to define a fuse followed by deposition of a layer of a metal, such as platinum, which is capable of reacting with the polysilicon to form a metal silicide. The structure is then sintered to form the metal silicide after which the remainder of the metal, e.g., platinum, is removed. Such a metal silicide fuse provides more reliability than prior art metal or metal alloy fuses, e.g., nichrome or platinum, in that the silicide material will not reflow back together as will other metals or metal alloys. Furthermore, less current is required to blow a metal silicide fuse than a prior art polysilicon fuse of equivalent dimensions.

The use of such a metal silicide fuse construction further permits the simultaneous formation of a Schottky diode structure in the region of the polysilicon and metal silicide layers over the substrate contact area, while forming the silicide fuse over an insulated portion of the substrate. Such a structure is described and claimed in Schlupp U.S. Pat. No. 4,518,981 which is also assigned to the assignee of this invention.

The use of metal silicide materials in integrated circuit structures is, of course, in general not new. For example, Chen et al, in an article entitled "A New Device Interconnect Scheme For SubMicron VLSI", published in 1984 in the International Electron Devices Meeting (IEDM) at pages 118-121, describe forming a refractory metal silicide interconnect by first depositing a layer of the refractory metal and then depositing and patterning a layer of silicon prior to forming the metal silicide interconnect.

Even with the use of metal silicide fuses, however, there remains a need for providing dimensional stability, particularly with respect to the thickness of the fuse, to both reduce the total amount of current flowing through the fuse as well as reduce the variation in the current needed to blow the fuse.

Furthermore, when the fuse is formed by first applying a layer of polysilicon, then applying a layer of metal, and finally sintering the materials to form the metal silicide, it is difficult to accurately control the resistance of the fuse. This is because it is difficult to accurately control the deposition of polysilicon so an excess is usually used. This excess amount of polysilicon remains under the metal silicide layer and cannot be removed without damaging the silicide layer. Since polysilicon is a conductor, this excess amount of polysilicon under the metal silicide in the fuse area will change the resistance of the fuse and thus change the amount of current needed to blow the fuse. Furthermore, since the resistivity of polysilicon varies with temperature, the amount of current needed to blow the fuse will be temperature dependent.

SUMMARY OF THE INVENTION

It is, therefore, an object of this invention to provide an improved metal silicide fuse for an integrated circuit structure.

It is another object of this invention to provide an improved metal silicide fuse for an integrated circuit structure wherein the thickness and resistivity of the fuse layer is controlled.

It is yet another object of this invention to provide an improved metal silicide fuse for an integrated circuit structure wherein the thickness of the fuse layer is controlled by the amount of metal used in forming the metal silicide fuse layer.

It is a further object of this invention to provide an improved metal silicide fuse for an integrated circuit structure wherein the thickness of the metal silicide fuse layer is controlled by first depositing, on a substrate, a measured layer of a metal capable of reacting with silicon to form a silicide, and then forming the silicide by placing a layer of amorphous silicon over the metal layer and sintering the structure to form the silicide.

It is yet a further object of this invention to provide an improved metal silicide fuse for an integrated circuit structure wherein the thickness of the fuse layer is controlled by removing the excess amorphous silicon remaining over the metal silicide fuse layer after forming the silicide.

These and other objects of the invention will be apparent from the following description and accompanying drawings.

In accordance with the invention, an improved metal silicide fuse for an integrated circuit structure comprises a metal silicide layer formed by first depositing a layer of known thickness of a metal capable of reacting with silicon to form a silicide and then depositing an excess amount of amorphous silicon over the metal and patterning it to form the desired fuse dimensions prior to formation of the silicide. The excess silicon over the metal silicide fuse is then removed after formation of the silicide. Control of the thickness of the metal forming the silicide controls the thickness of the silicide formed to thereby form a fuse of reproducible thickness.

DESCRIPTION OF THE PREFERRED EMBODIMENTS

The metal silicide fuse of the invention is characterized by a controlled thickness which is reproducible by the initial deposit of a controlled amount of a metal capable of reacting with a subsequently applied silicon to form a metal silicide. By controlling the thickness of this metal and then applying an excess amount of silicon over the metal, a reproducible thickness of metal silicide will be formed and the excess unreacted silicon over the metal silicide can be removed. Coupling such control of thickness with accurate patterning of the silicon layer will provide an accurate and reproducible fuse of constant cross-section which, in turn, will require a known amount of current to blow the fuse.

Figure 1:
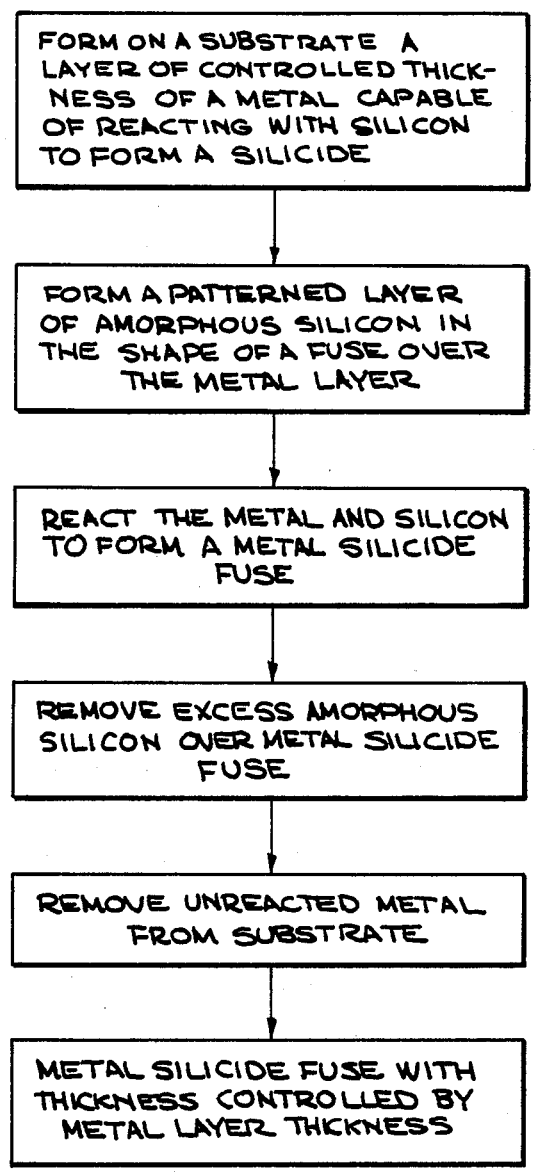
FIG. 1 is a flowsheet illustrating the process of forming the novel fuse of the invention.
Figure 2:
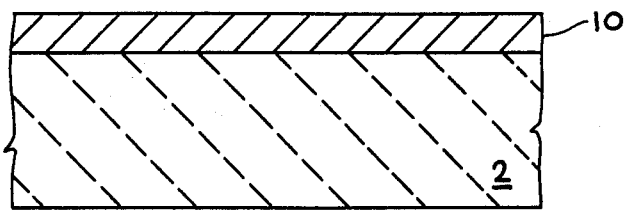
FIGS. 2–5 are side section views of an integrated circuit structure illustrating sequential steps in forming the fuse of the invention.

FIGS. 2–11 illustrate, in step by step sequence, the construction of the improved metal silicide fuse structure of the invention. Turning now to FIG. 2, a silicon substrate 2 has a layer 10 of silicon dioxide formed thereon which may be a deposited layer, e.g., CVD or a thermally grown layer.

Figure 3:
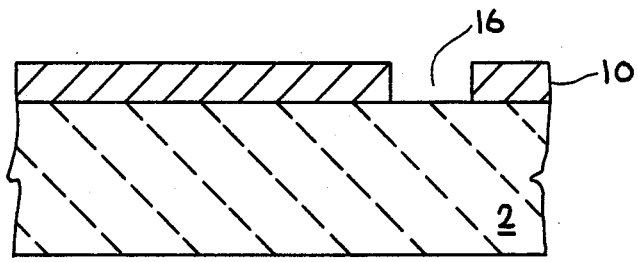

An opening 16 is patterned in layer 10, as shown in FIG. 3, to form a first contact from the fuse to be formed to a device on the substrate, such as, for example, a Schottky diode, as described in the aforementioned Schlupp patent, cross-reference to which is hereby made. Alternatively, opening 16 may be formed by masking substrate 2 before forming oxide layer 10 thereon.

Figure 4:
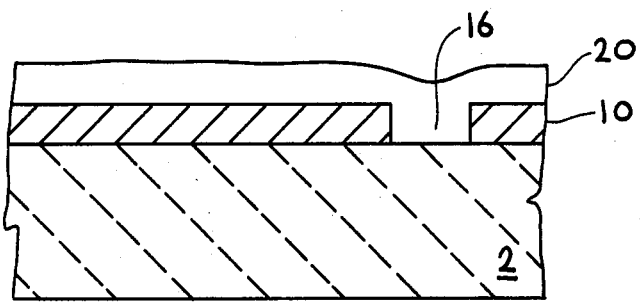

A layer 20 of metal capable of reacting to form a silicide is then applied over layer 16, as shown in FIG. 4. Such a metal will be herein referred to at times as a "silicide metal" which is defined, for purposes of this invention, as any metal capable of reacting with silicon to form a conductive metal silicide. Such metals include, for example, a refractory metal, such as titanium or zirconium; nickel; cobalt; or one of the platinum metals. The metal may be applied by sputtering to a depth of about 25 to 1000 Angstroms, preferably about 100 to 500 Angstroms, and most preferably about 150 to 250 Angstroms. A preferred metal for use in the formation of the metal silicide is platinum which is applied to a thickness of preferably about 150 to 250 Angstroms and most preferably about 200 Angstroms. The thickness may be monitored, for example, using well known 4 point probe measurement techniques.

It should be noted that control of the thickness of the metal applied is a very important part of this invention since this thickness will ultimately control the amount of metal silicide produced which, in turn, will control the thickness of the fuse since all unreacted excess silicon will be removed.

Figure 5:
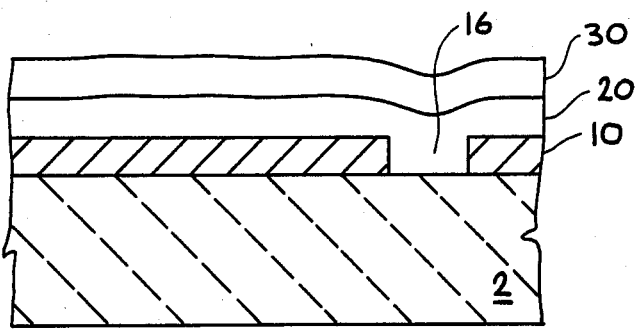
Figure 6:
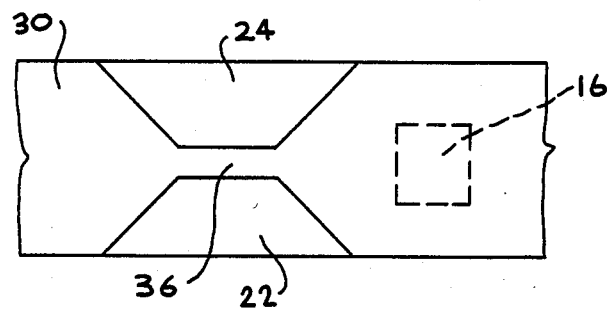
FIG. 6 is a top view illustrating a further step in forming the fuse of the invention.

In FIG. 5, the structure is illustrated with a layer 30 of silicon applied over metal layer 20. Preferably, silicon layer 30 comprises a non crystalline silicon material, hereinafter referred to as amorphous silicon. The use of amorphous silicon is preferred over polysilicon since the temperatures normally used to form a layer of polysilicon are higher than the siliciding temperature (560° C.) and it is desirable to mask and etch the silicon after the formation step but prior to the siliciding step to remove the silicon from area where formation of a metal silicide layer is not desired. If polysilicon can be applied in a manner which will permit patterning of the silicon prior to the siliciding step, then it may be used in place of amorphous silicon.

When the layer of silicon is formed by deposition, about 400 Angstroms or more of amorphous silicon is applied to insure the presence of excess silicon after forming the metal silicide. After application of amorphous silicon layer 30, the silicon is masked and then plasma etched to expose portions 22 and 24 of underlying metal layer 20 defining a bow tie pattern for the fuse to be formed with a narrow fusible section shown at 36 in FIG. 6.

Alternatively, amorphous silicon layer 30 may be formed by sputtering silicon over metal layer 20 after sputtering metal layer 20 onto underlying layer 16. However, one must still mask and etch silicon layer 30 prior to the siliciding step to remove silicon from areas where formation of metal silicide is not wanted. The advantages of applying silicon layer 30 by sputtering include the possible use of the same equipment used in applying silicide metal layer 20 and the ability to more accurately control the thickness of silicon layer 30.

Figure 7:
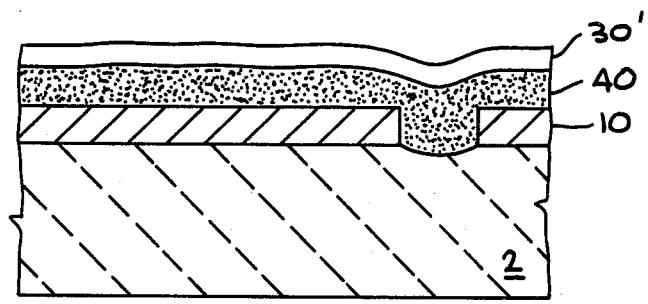
FIG. 7 is a side section view of another step in forming the fuse of the invention.

The metal silicide is now formed by heating the structure for about 10 to 40 minutes, preferably about 15 to 30 minutes, to a sintering temperature of from about 200 to 1000° C., depending upon the particular silicide metal e.g., a temperature of about 560° C. for about 20 minutes for platinum. All of metal layer 20 beneath amorphous silicon layer 30 reacts with the silicon to form metal silicide layer 40 leaving an excess amount of amorphous silicon 30' over layer 40 as shown in FIG. 7.

Figure 8:
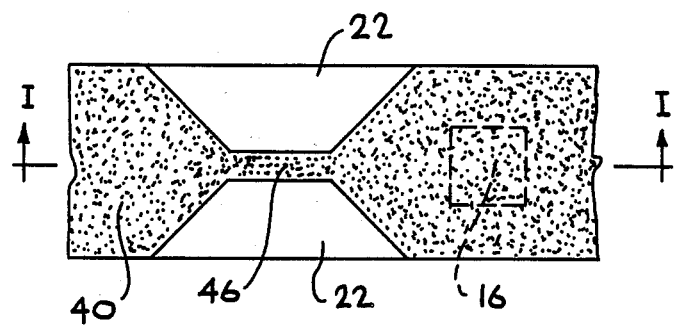
FIG. 8 is a top view showing the next step in forming the fuse of the invention.
Figure 9:
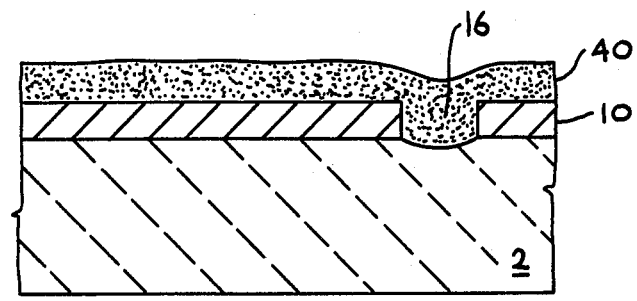
FIG. 9 is a side section view of FIG. 8 taken along lines I—I.

As illustrated in both FIGS. 8 and 9, metal layer 20, where it contacts underlying silicon substrate 10 at 16, reacts with both amorphous silicon layer 30 over metal layer 20 and silicon substrate 10 to form metal silicide portion 42 in opening 16 to thereby form a Schottky diode with the remainder of silicon substrate 10.

Following formation of metal silicide layer 40, the excess amorphous silicon material 30' is removed such as by a plasma etch to expose the patterned metal silicide layer 40 including narrow fuse area 46 and the remaining metal portions 22 and 24 where no amorphous silicon was present to react with metal layer 20 to form the silicide as seen in FIG. 8.

As previously discussed, in an alternate embodiment, silicon layer 30 may also be applied by sputtering in which case it may be possible to control the amount of amorphous silicon deposited sufficiently to provide the exact amount needed for reaction with all of the previously deposited metal in metal layer 20. This would effectively eliminate the need for removal of excess unreacted silicon 30' over metal silicide layer 40 since there would be no excess amorphous silicon.

Figure 10:
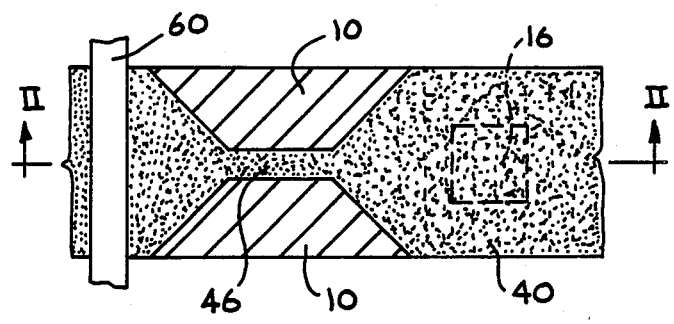
FIG. 10 is a top view of the fuse structure of the invention after completion.
Figure 11:
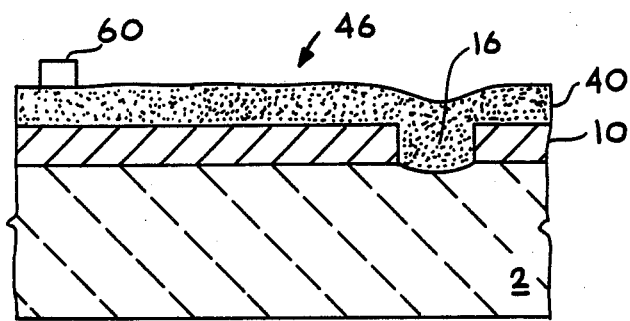
FIG. 11 is a side view of the completed fuse structure shown in FIG. 10 taken along lines II—II.

Metal portions 22 and 24 are then removed using a selective etchant, such as aqua regia, which will not react with the metal silicide. A metal layer, such as a layer of aluminum, is then applied and patterned using, for example a TiW mask, to form the other contact 60 for the fuse as illustrated in FIGS. 10 and 11. A protective glass layer (not shown) may then be applied to the fuse after forming the metal contact.

The novel fuse 46 of the invention is thus provided with an accurate and reproducible length and cross-sectional area by patterning the amorphous silicon and by accurate control of the thickness of the underlying metal area which results in the formation of a known thickness, length, and width of metal silicide. Furthermore, the depth or thickness of the metal silicide fuse 46 can be made as thin as desired by limiting the thickness of metal layer 20 since any excess unreacted amorphous silicon, remaining after the silicide reaction, is removed. Thus, a lower current may be used to blow the fuse which, in turn, will generate less heat.

Having thus described the invention, what is claimed is:

1. A method of forming an improved metal silicide fuse of controlled thickness on an integrated circuit structure comprising a silicon substrate which comprises:
   (a) forming on said underlying silicon substrate a layer of a predetermined amount of a metal capable of reacting with silicon to form a silicide;
   (b) forming over said metal a layer of silicon in excess of the amount needed to react with all of said underlying metal;
   (c) patterning said silicon layer to form the desired fuse width and length prior to formation of the silicide; and
   (d) heating said structure to a temperature sufficient to cause said metal and said patterned silicon to react to form the desired metal silicide.

2. The process of claim 1 including the further step of removing unreacted portions of said silicon layer and said metal from said structure after formation of said metal silicide fuse.

3. The process of claim 2 including the further step of forming a layer of an insulating material on said underlying structure prior to forming said metal layer.

4. The process of claim 3 including the further step of patterning said insulating layer to provide at least one opening therethrough to a conductive portion of said structure under said insulating layer.

5. The process of claim 4 wherein said step of patterning said insulating layer comprises providing at least one opening to said underlying silicon substrate whereby said subsequent step of heating said structure to form said metal silicide from said metal layer and said silicon layer will form a Schottky diode between said metal silicide and said silicon substrate at said opening.

6. The process of claim 2 wherein said step of forming on said structure said predetermined amount of said metal comprises forming, on said insulating layer, a layer of said metal having a thickness of from about 25 to 1000 Angstroms.

7. The process of claim 6 wherein said step of forming said layer of metal capable of reacting with silicon to form a metal silicide comprises forming a layer of a metal selected from the class consisting of nickel, cobalt, refractory metals, and platinum metals.

8. The process of claim 7 wherein said step of forming said layer of metal capable of reacting with silicon to form a metal silicide comprises forming a layer of platinum.

9. The process of claim 7 wherein said step of forming said layer of metal capable of reacting with silicon to form a metal silicide comprises forming a layer of titanium.

10. The process of claim 2 wherein the step of forming said silicon over said metal layer comprises forming a layer of amorphous silicon over said metal layer.

11. The process of claim 10 wherein said step of heating said metal and said amorphous silicon to a temperature sufficient to form said silicide comprises heating said structure to a temperature of from 200° to 1000° C. for a time period of 10 to 40 minutes.

12. The process of claim 11 wherein said metal comprises platinum and said step of heating comprises heating platinum and amorphous silicon to a temperature of at least 560° C. for a time period of at least 20 minutes to form platinum silicide.

13. The process of claim 10 wherein said step of removing unreacted metal and silicon from said structure comprises the steps of first removing unreacted amorphous silicon on top of said previously formed layer of metal silicide and then removing unreacted metal from areas where said amorphous silicon was removed prior to formation of said metal silicide layer.

14. A method of forming an improved platinum silicide fuse for an integrated circuit structure having a controlled thickness which comprises:
   (a) forming a patterned layer of silicon dioxide on said structure;
   (b) forming on said silicon dioxide layer from 150 to 250 Angstroms of platinum metal;
   (c) forming over said platinum an amount of amorphous silicon in excess of the amount needed to react with all of said underlying platinum to form a platinum silicide layer;
   (d) patterning said amorphous silicon to form the desired fuse width and length prior to formation of said silicide;
   (e) heating said structure to a temperature of at least 560° C. for at least 20 minutes to cause said amorphous silicon to react with all of said platinum lying beneath said amorphous silicon to form the desired platinum silicide;
   (f) removing unreacted portions of said amorphous silicon remaining on said newly formed layer of platinum silicide; and (g) then removing at least a portion of the remaining unreacted platinum from areas on said structure where said amorphous silicon was removed prior to forming said platinum silicide layer.

15. A method of forming an improved platinum silicide fuse for an integrated circuit structure having a controlled thickness which comprises:
   (a) forming a patterned layer of silicon dioxide on said structure;
   (b) sputtering on said silicon dioxide layer from 150 to 250 Angstroms of platinum metal;
   (c) sputtering over said platinum an amount of amorphous silicon substantially equivalent to the amount needed to react with all of said underlying platinum to form a platinum silicide layer;
   (d) patterning said amorphous silicon to form the desired fuse width and length prior to formation of said silicide;
   (e) heating said structure to a temperature of at least 560° C. for at least 20 minutes to cause said amorphous silicon to react with all of said platinum lying beneath said amorphous silicon to form the desired platinum silicide; and
   (f) removing at least a portion of the remaining unreacted platinum from areas on said structure where said amorphous silicon was removed prior to forming said platinum silicide layer.

* * * * *